United States Patent [19]
Staples

[11] 3,984,768
[45] Oct. 5, 1976

[54] APPARATUS FOR HIGH VOLTAGE RESISTANCE MEASUREMENT

[75] Inventor: James T. Staples, Detroit, Mich.

[73] Assignee: Champion Spark Plug Company, Toledo, Ohio

[22] Filed: June 11, 1975

[21] Appl. No.: 585,785

[52] U.S. Cl. .................................. 324/62; 324/15
[51] Int. Cl.² .................................. G01R 27/02
[58] Field of Search ............................. 324/62, 15

[56] References Cited
UNITED STATES PATENTS

| | | | |
|---|---|---|---|
| 3,676,770 | 7/1972 | Sharaf et al. | 324/62 |
| 3,731,189 | 5/1973 | Sharaf et al. | 324/62 |

Primary Examiner—Stanley T. Krawczewicz
Attorney, Agent, or Firm—Oliver E. Todd, Jr.

[57] ABSTRACT

Improved method and apparatus for measuring the effective operating resistance of an unknown resistance element to which repetitive high voltage pulses are normally applied during operation. As each high voltage pulse is applied to the element, the voltage across the element and the current through the element are simultaneously sampled during voltage peak or at any other desired point in each pulse. The voltage and current samples are digitized and used in digitally computing the effective operating resistance of the unknown element. The computed resistance is displayed on a digital indicator.

4 Claims, 8 Drawing Figures

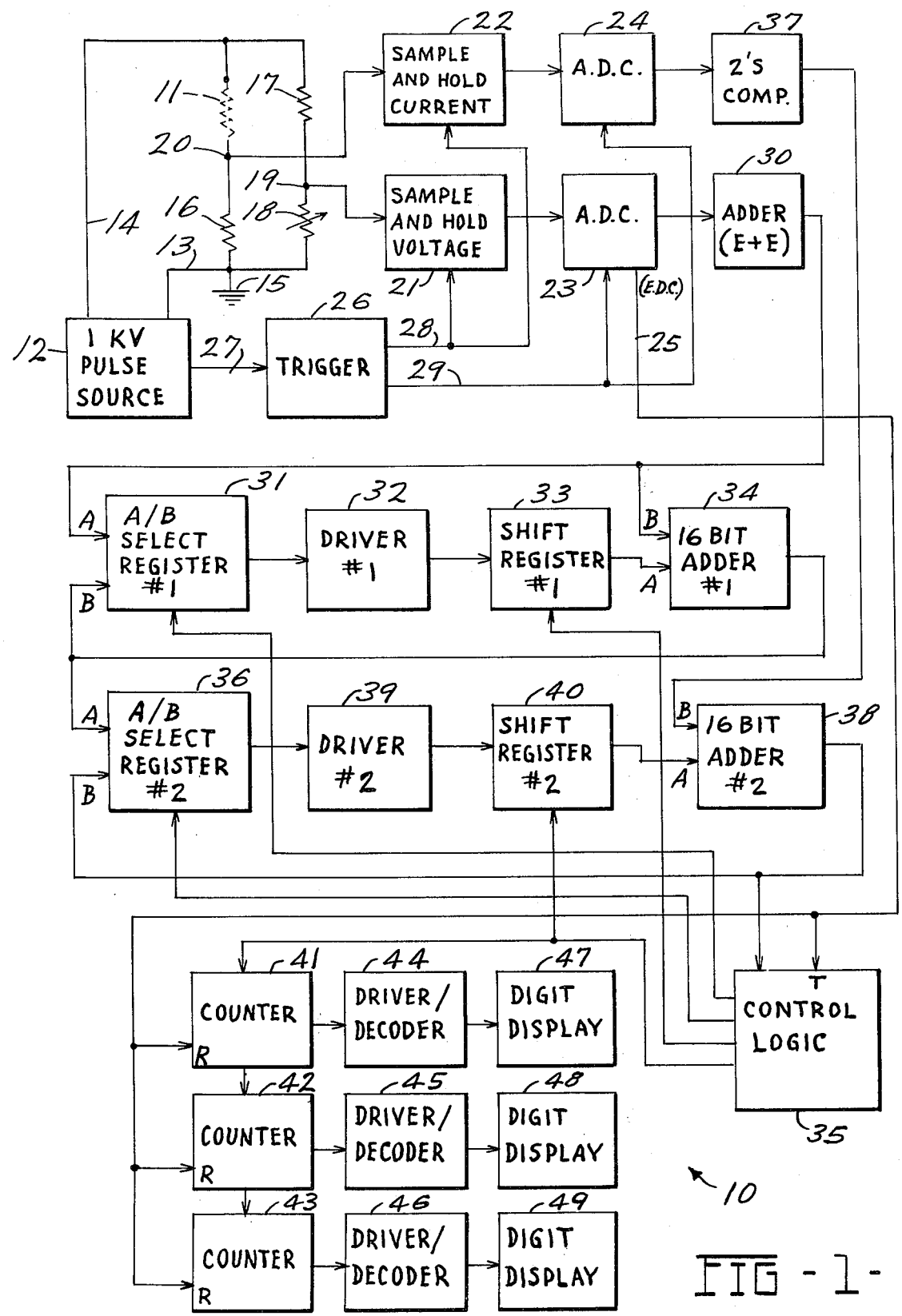
FIG-1-

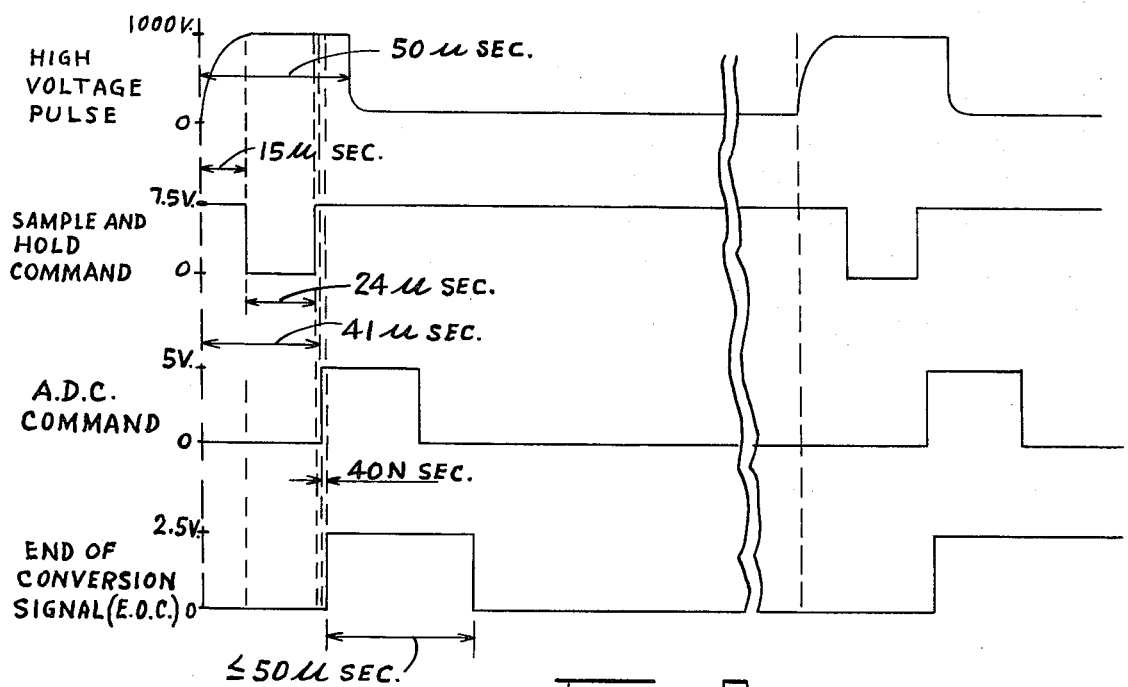
FIG-2-
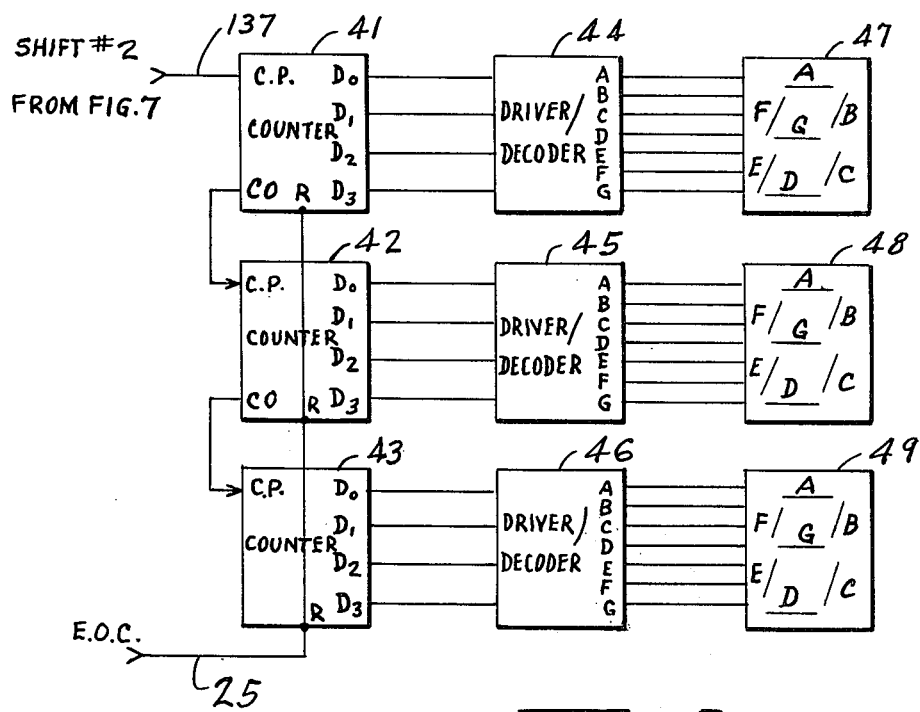
FIG-8-

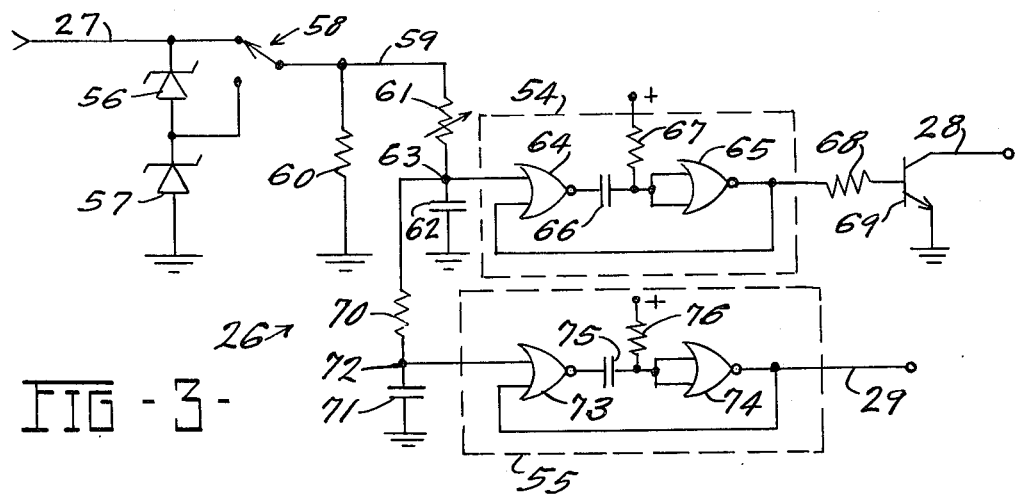
FIG-3-
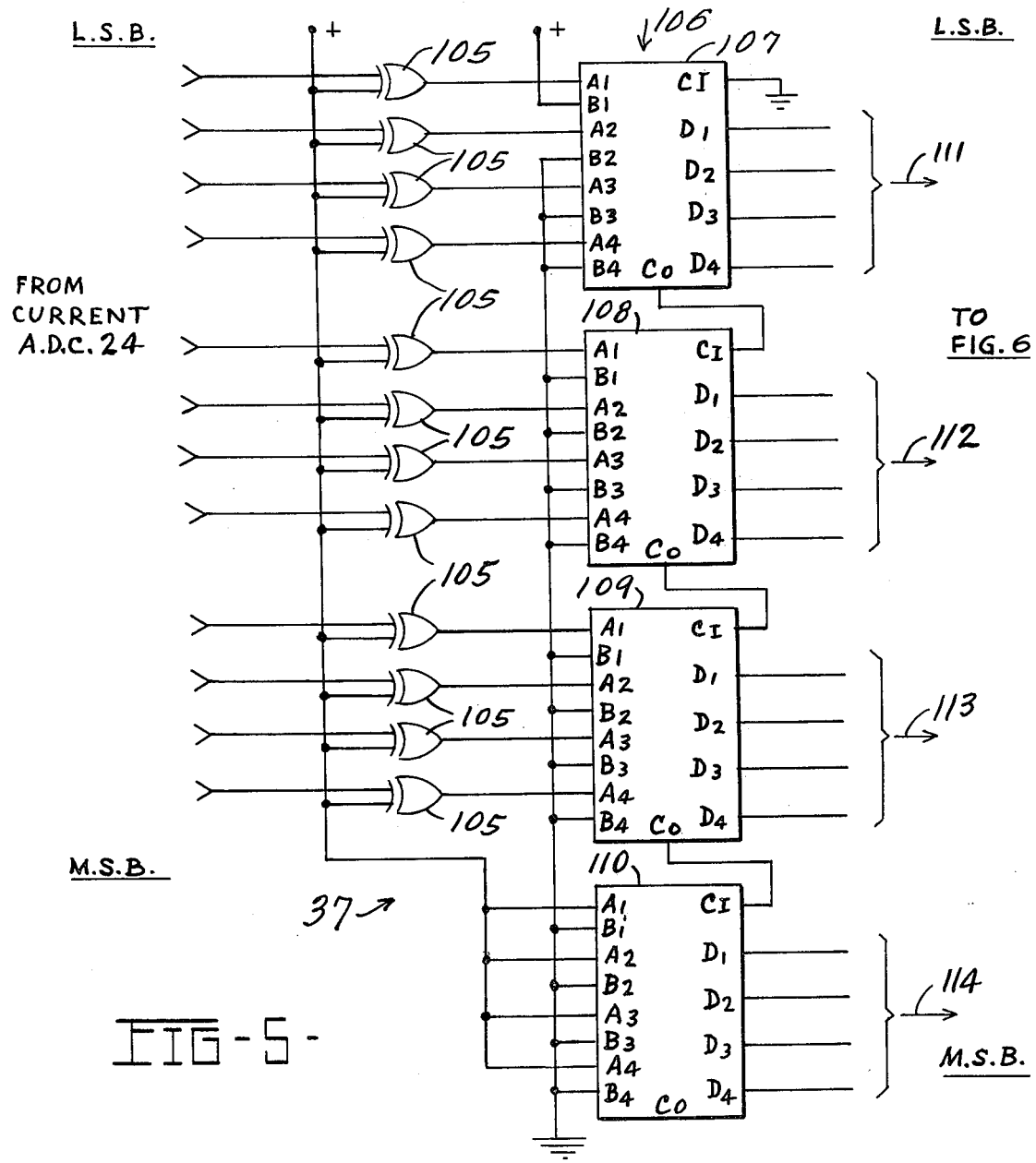
FIG-5-

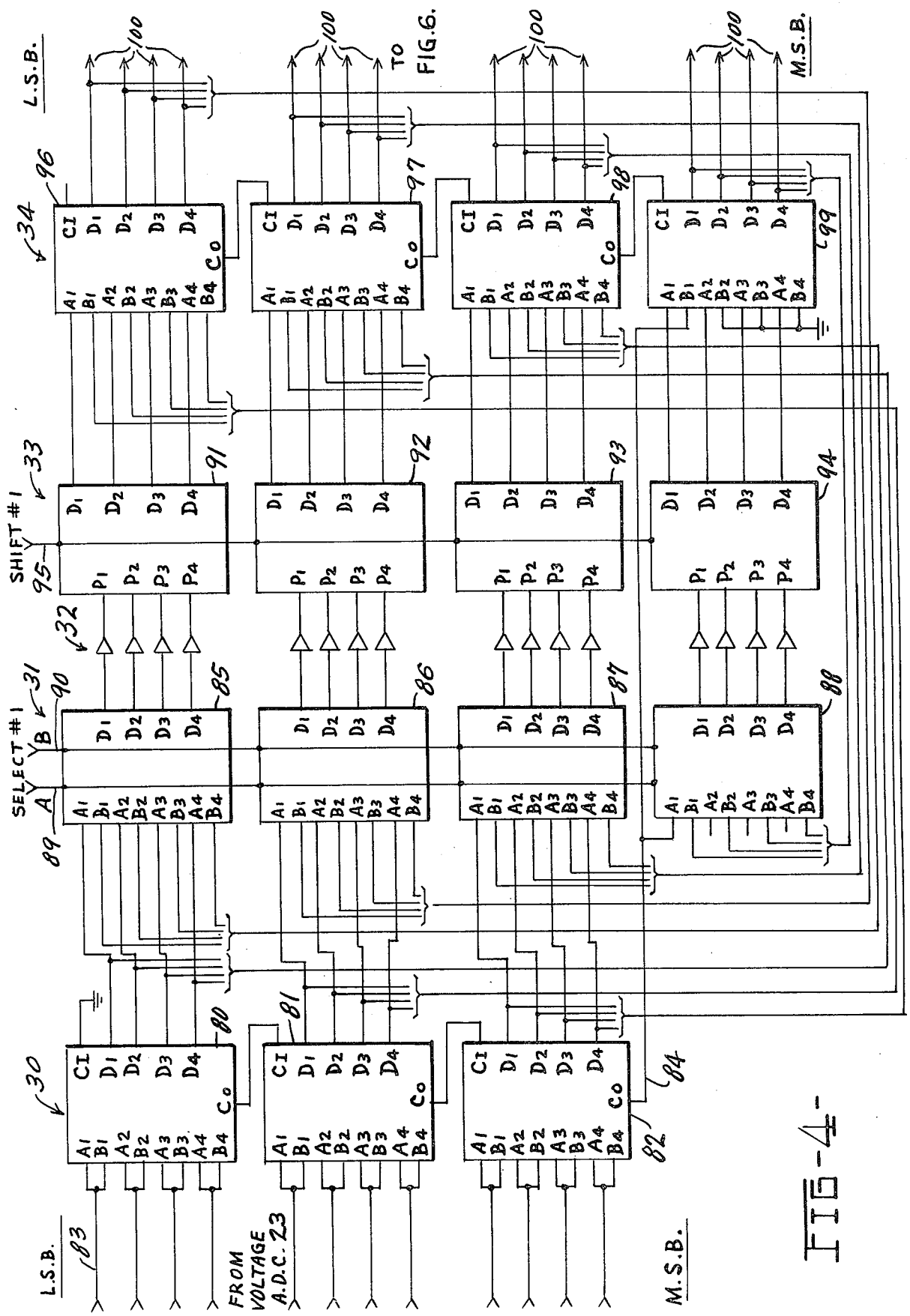

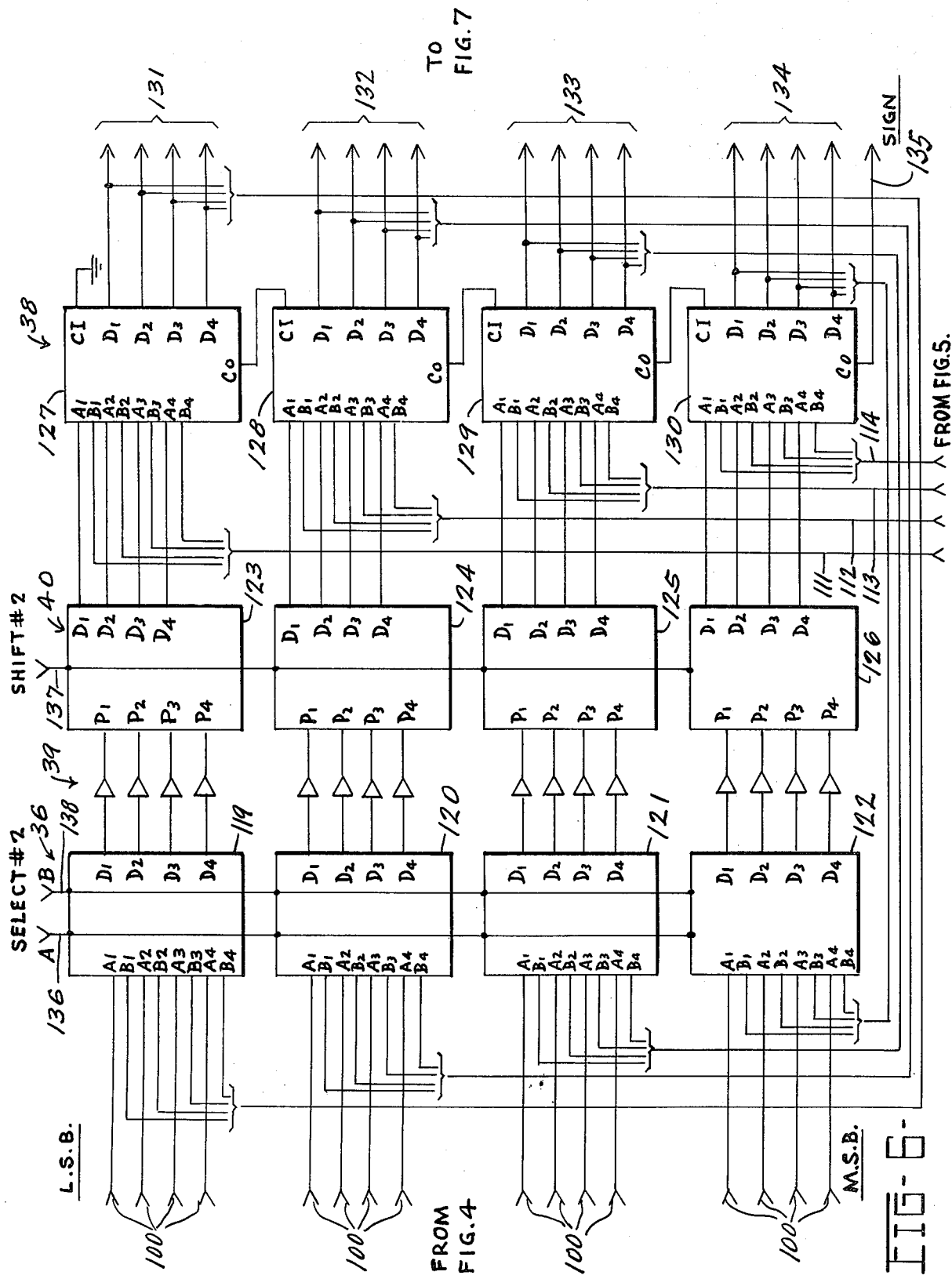

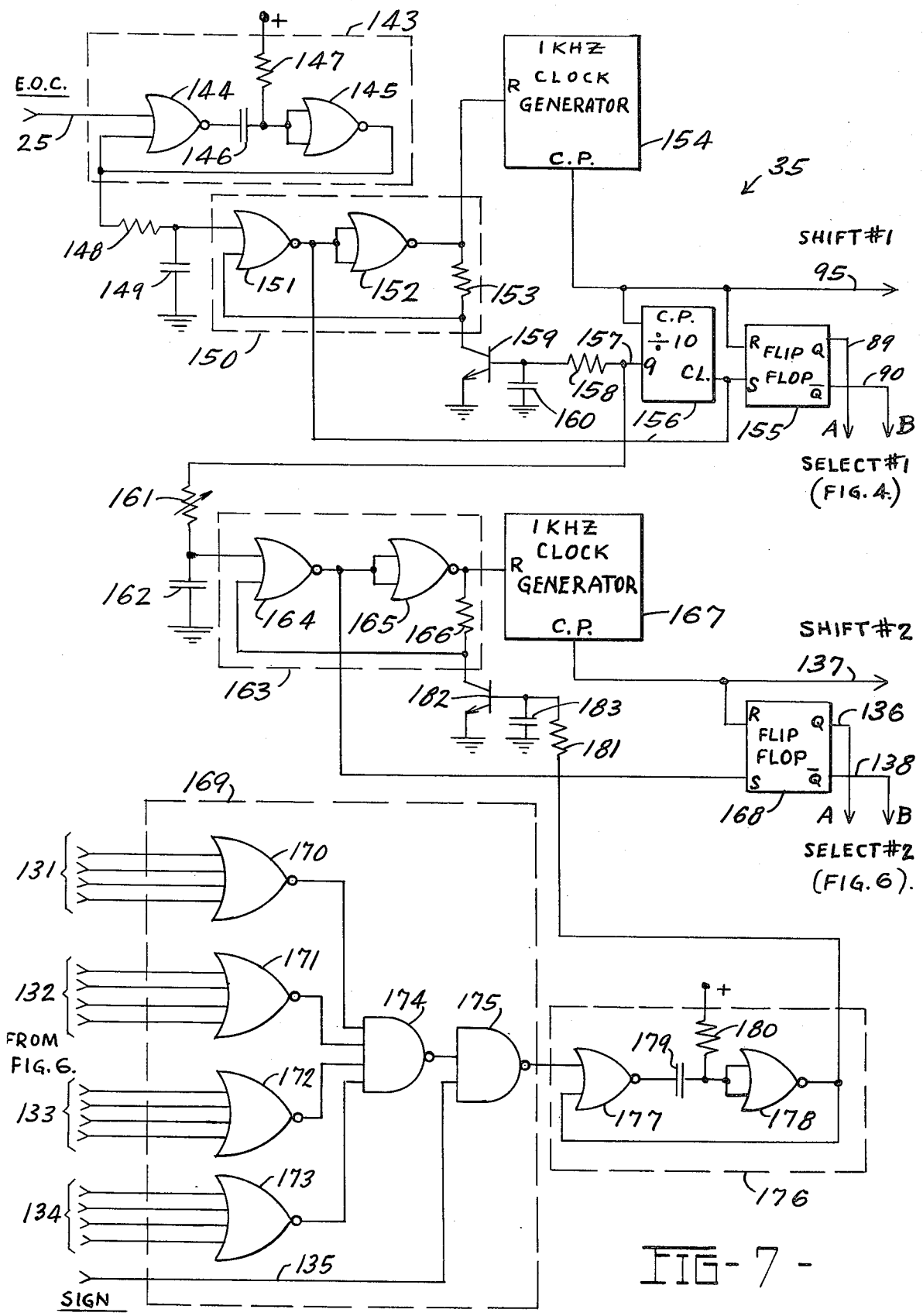

3,984,768

APPARATUS FOR HIGH VOLTAGE RESISTANCE MEASUREMENT

BACKGROUND OF THE INVENTION

This invention relates to resistance measurements and more particularly to an improved method and apparatus for measuring the operating resistance of an unknown resistance element to which repetitive high voltage pulses are applied.

Under certain applications, a resistance element may be subjected to repetitive high voltage pulses during operation. For example, radio frequency ignition noise suppression elements are commonly placed within the high voltage ignition circuit for a spark-ignited internal combustion engine. The suppression elements may be in the form of a distributed resistance or impedance in high voltage ignition cables or in the form of a lumped resistance or impedance element placed, for example, within the center electrode assembly of a spark plug. During operation of the engine, repetitive high voltage pulses of short duration are applied to the spark plugs in the engine for igniting a fuel-air mixture. Each high voltage pulse passes through an element which suppresses spurious emissions from the ignition system.

Heretofore, it has been difficult to accurately measure the resistance of an ignition noise suppression element under its operating conditions. A typical procedure for making such a measurement involved using an oscilloscope for measuring the peak voltage across and the peak current through the element while the element is subjected to high voltage pulses. The measured voltage is then divided by the measured current to obtain a measure of the effective operating resistance. Another method for measuring the resistance under high voltage conditions is with a resistance meter designed to apply a continuous high D.C. voltage to the unknown element and to determine the resistance from the current through the unknown element and the known voltage. Howevr, I²R losses within the element are appreciably greater then when high voltage pulses are applied to the element. As a consequence, the element is heated to a greater than normal temperature, resulting in an erroneous resistance indication.

SUMMARY OF THE INVENTION

According to the present invention, the resistance of an unknown element is measured while high voltage pulses are applied to such element. A high voltage pulse source is connected to apply repetitive high voltage pulses to the unknown resistance element. When the voltage has stabilized a short time interval after the initial application of a pulse, the voltage across and the current through the element are simultaneously sampled and stored. These analog samples are then applied to analog-to-digital converters wherein they are digitized. The current is then digitially divided into the voltage to obtain a measure of the resistance of the unknown element under high voltage pulse conditions, similar to those encountered in normal operation of the unknown resistance element. Division is accomplished, for example, by repeatedly adding the 2's complement of the digitized current to the digitized voltage until either the result equals zero or the sign of the result changes. A count of the number of times that the 2's complement is added to the digitized voltage equals the resistance of the unknown element. Such count is stored in a counter for driving a digital display which indicates the measured resistance.

Accordingly, it is an object of the invention to provide an improved method and apparatus for measuring the resistance of an unknown element while such element is subjected to high voltage pulses.

Another object of the invention is to provide improved method and apparatus for measuring the resistance of an ignition noise suppression element for an internal combustion engine while such element is subjected to high voltage pulse similar to the ignition pulses encountered by the element in an operating engine.

Other objects and advantages of the invention will become apparent from the following detailed description, with reference being made to the accompanying drawings.

BRIEF DESCRIPTION OF THE DRAWINGS

FIG. 1 is a schematic block diagram of resistance measuring apparatus according to a preferred embodiment of the present invention;

FIG. 2 is a graph showing the operating sequence of the resistance measuring apparatus of FIG. 1;

FIG. 3 is a detailed schematic circuit diagram of a trigger circuit for timing the current and voltage sampling and the analog-to-digital conversion with respect to application of high voltage pulses to the unknown resistance being measured;

FIG. 4 is a schematic circuit diagram of a portion of the resistance measuring apparatus of FIG. 1 which expands the range of the digitized voltage sample;

FIG. 5 is a detailed circuit diagram of apparatus for generating the 2's complement of the digitized current sample for use in the apparatus of FIG. 1;

FIG. 6 is a detailed schematic circuit diagram of a portion of the resistance measuring apparatus of FIG. 1 which divides the expanded digitized voltage sample by the digitized current sample;

FIG. 7 is a detailed circuit diagram of control logic for timing and controlling operation of the resistance measuring apparatus of FIG. 1; and FIG. 8 is a detailed circuit diagram of an output counter and display for the resistance measuring apparatus of FIG. 1.

DESCRIPTION OF A PREFERRED EMBODIMENT

Turning to the drawings and particularly to FIG. 1, apparatus 10 is shown for measuring the resistance of an unknown element 11 while such element 11 is subjected to repetitive high voltage pulses. It will be assumed that the unknown element 11 has at least a minimum resistance, say 1000 ohms or 1 K. ohms, since high voltage pulses would normally not be applied to lower value resistors. For the apparatus 10 described herein, it will also be assumed that the resistance has a maximum value of, say, 999,000 ohms or 999 K. ohms. Of course, the capacity of the apparatus 10 may be increased by increasing the range of the output display into the megohm region or the range covered by the apparatus 10 may be changed to meet other resistance measuring requirements.

A high voltage pulse source 12 of conventional design is provided for generating repetitive high voltage pulses of short duration. For example, the pulse source 12 may generate a square wave pulse train having a pulse duration of 50 microseconds and a peak voltage of 1000 volts. The high voltage pulses are applied from the source 12 to a pair of output lines 13 and 14. The output line 13 is connected to a ground connection 15 and through a low valued non-inductive current sensing resistor 16 to one terminal of the unknown element 11. The output line 14 is connected to the other terminal of the unknown element 11. Thus, pulses from the pulse source 12 flow in series through the resistor 16 and the unknown element 11. The current through the series resistor 16 and unknown element 11, and hence the voltage appearing across the resistor 16, is directly proportional to the current flow through the element 11 and the series resistor 16. A voltage divider consisting of a high valued fixed resistor 17 and an appreciably lower valued variable resistor 18 is connected across the lines 13 and 14. A voltage appearing from a common junction 19 between the resistors 17 and 18 and ground will be directly proportional to the voltage applied to the unknown element 11. If, for example, the resistor 17 has a value of one megohm and the variable resistor 18, having a maximum resistance of 20 K ohms, is adjusted until five volts appear between the junction 19 and the ground 15 when one kilovolt is applied between the lines 13 and 14.

The analog voltage appearing at a junction 20 between the current sensing resistor 16 and the unknown element 11 is directly proportional to the current through the unknown element 11, as indicated above, and the analog voltage appearing at the junction 19 is directly proportional to the voltage applied across the unknown element 11. These analog voltages are digitized and used for computing the resistance of the unknown element in accordance with Ohm's Law. The junction 19 is connected to an analog input terminal to a sample and hold circuit 21 and the junction 20 is connected to an analog input terminal to a sample and hold circuit 22. The sample and hold circuits 21 and 22 are of a conventional design such as the commercially available Model SHM-4 sample and hold device produced and sold by Datel Systems, Inc. of Canton, Massachusetts. When triggered, such a sample and hold circuit will sample an analog input voltage ranging between zero and ten volts, for example, and will store and maintain such sampled analog voltage at an output terminal over a period of time. The SHM-4 sample and hold device is particularly desirable since it has an acquisition time only 6 microseconds for sampling and storing a voltage and has a relatively low output droop rate of only 20 microvolts per millisecond. Furthermore, the input impedance is on the order of 100 megohms and therefore will not appreciably affect the voltages on the junctions 19 and 20. The analog output of the sample and hold circuit 21, which is proportional to the voltage across the unknown element 11, is applied to an analog input to an analog-to-digital converters 23 and the analog input of the sample and hold circuit 22, which is proportional to the current through the unknown element 11, is applied to an analog input to an analog-to-digital converter 24. The converters 23 and 24 are of a conventional design, such as the Model ADC-D12B analog-to-digital converter manufactured by Datel Systems, Inc. Such a converter is designed for an analog input voltage of from zero to 10 volts and generates 12 bits of output data corresponding to the digitized value of the analog input. Of course, it will be appreciated that other known types of sample and hold circuits and analog-to-digital converters may be used to replace the above-described exemplary sample and hold circuits 21 and 22 and converters 23 and 24.

The Datel type ADC-D12B analog-to-digital converter requires up to 50 microseconds for converting an analog signal to up to 12 bits of binary data. The actual conversion time depends upon the magnitude of the input voltage. During the time of conversion, the converters generate an output signal such as a signal applied on an output 25 from the converter 23. At the end of conversion, the output 25 returns to zero to indicate that conversion has been completed. The end of conversion output from the converter 24 may not be used since the voltage conversion signal may be set to a higher value than the current conversion signal and therefore the voltage converter 23 will require a greater time for conversion than the converter 24. As an alternative, the end of conversion outputs from both converters 23 and 24 may be connected through an AND gate (not shown) to the output 25 for applying a signal on the output 25 only after both converters 23 and 24 have completed conversion. The trigger circuit 26 also controls the time at which the sample and hold circuits 21 and 22 acquire and store analog voltages from the junctions 19 and 20, respectively.

When the pulse source 12 applies a voltage pulse to the output lines 13 and 14, a similar pulse of a much lower magnitude is applied to a line 27 for activating the trigger circuit 26. This lower magnitude voltage pulse may be taken, for example, from a voltage divider connected internally of the pulse source 12 across the output lines 13 and 14. The low voltage pulse applied on the line 27 may, for example, be on the order of 15 or 20 volts during the time that a high voltage pulse is applied to the unknown element 11. The trigger cicuit 26 waits a predetermined short time interval after first receiving a pulse on the output 27 to allow the voltage pulse across the unknown element 11 to stabilize and then applies a signal on an output 28 for activating the sample and hold circuits 21 and 22 to acquire and store the analog signals corresponding to the voltage across and current through the element 11. After such signals are acquired by the sample and hold circuits 21 and 22, a signal is removed from the output 28 and a short interval later a signal is applied to an output 29 for initiating conversion by the analog-to-digital converters 23 and 24. The converter 23 then maintains a signal on the output 25 until conversion is completed, at which time the converters 23 and 24 have digital outputs corresponding respectively to the voltage across and current through the unknown element 11.

It will be appreciated from Ohm's Law that the value of the unknown resistance element will be equal to the voltage appearing across the element divided by the current through such element. Division is accomplished by a method which involves repeated addition of the 2's complement of the digitized binary current directly to the digitized binary voltage. Addition is repeated until either the result goes to zero for each binary digit or the sign of the result changes from positive to negative. A count of the number of times in which the 2's complement of the digitized current is added to the digitized voltage to obtain a count of zero or a change of sign equals the result from the division, or the resistance being measured. As will be discussed in greater detail below, such count is accumulated in a counter and the output of the counter is used for driving a digital display. The following charge illustrates the division method which involves the repeated addition of the 2's complement of the binary current to the binary voltage for an assumed voltage of 20 volts and current of 4 volts to obtain a resistance of five ohms:

EXAMPLE OF DIVISION

| Assume | Binary Equivalent | 2's Complement |
|---|---|---|
| Current = 4 = | 00100 | 11100 |
| Voltage = 20 = | 10100 | |
| $R = \dfrac{E}{I} = \dfrac{20}{4} = 5$ | | |

```
                                    Clock Pulse Count
        E    —    10100
        I    —   +11100              1
  (sign bit) 1    10000
                 +11100              2
              1   01100
                 +11100              3
              1   01000
                 +11100              4
              1   00100
                 +11100              5
              1   00000           Division Completed
```

The exemplary Datel Model SHM-4 sample and hold circuit has an input analog voltage range of from zero to 10 volts. It is desirable to apply an analog voltage in the middle of this range or of about 5 volts to the voltage sample and hold circuit 21. Thus, the resistor 17 was selected to have a value of 1 megohm while the variable resistor 18 was adjusted to have a value of 20 K. ohms in the exemplary apparatus 10 for voltage pulses from the pulse source 12 on the order of 1 kilovolt. The five volt signal is reassembled to represent a scale of from zero to 100 volts prior to the division process. First, the digitized output from the voltage analog-to-digital converter 23 is doubled in a full binary adder 30, to give a binary output ranging from zero to 10 volts. Through the use of an A/B selector register 31, a set of driver amplifiers 32, a shift register 33, a 16-bit adder 34 and suitable check pulses from control logic 35, the output from the adder 30 is multiplied by a factor of 10. The control logic 35 clocks the output from the adder 30 to initially pass through the register 31 to the register 33. Upon the occurrence of a first clock pulse from the control logic 35 to a shift input to the register 33, the adder 34 adds the output from the register 31 to the output from the adder 30. The control logic 35 next enables the B input to the register 31 to apply the output from the adder 34 to the shift register 33. The control logic 35 continues to apply clock pulses to the shift register 33 to repeatedly add the output from the adder 34 to the output from the adder 30 until the accumulated sum in the adder 34 equals 10 times the output of the adder 30. The output of the adder 34 is then applied to an A input of an A/B select register 36.

A digitized signal corresponding to the current through the unknown resistance element 11 appears at the output from the analog-to-digital converter 24. This signal is applied to a circiuit 37 which generates the 2's complement of the current. The 2's complement of the current is applied to a B input of a 16-bit full binary adder 38. The adder 38 has an output which equals the sum of two binary signals applied to an A input and a B input. The output from the adder 38 is connected to the B input of the select register 36. The output of the register 36 is applied through driver amplifiers 39 and a shift register 40 to the A input to the adder 38. An A/B select signal for the select register 36 and clock pulses for the shift register 40 are generated by the control logic 35. The control logic 35 initially selects the A input of the register 36 to cause the expanded binary voltage signal to be added in the adder 38 to the 2's complement of the binary current signal. The control logic 35 then causes the result to pass through the B input of the select register 36 and through the shift register 40 to the adder 38 where it is again added to the 2's complement of the current from the circuit 37. The output of the register 36 is clocked through the shift register 40 to the A input of the adder 38 by the control logic 35 each time addition takes place. The addition cycle is repeated until either the result equals zero or the sign of the result changes. The resultant number of additions, which corresponds to the number of clock pulses to the shift register 40, is equal to the resistance of the element 11.

The clock pulses to the shift register 40 are also accumulated in counters 41, 42 and 43. The counter 41, which stores the least significant digit of the output data, counts ten pulses and carries over to the counter 42. Similarly, the counter 42 counts to 10 pulses and carries over to the counter 43 which stores the most significant digit of the output data. The counters 41–43 provide binary coded decimal (BCD) outputs representing the decimal digits stored in the counters 41–43. The binary outputs from the counters 41–43 are connected through drivers 44, 45 and 46 to digital indicators 47, 48 and 49, respectively. If the apparatus 10 is designed such that unknown resistance elements 11 within a range of 1 K. ohm to 999 K. ohms are displayed, then the indicator 47 will show 1 K. ohm units, the indicator 48 will show 10 K. ohm units and the indicator 49 will show 100 K. ohm units. Of course, the apparatus 10 may be readily modified to measure and indicate resistances in other ranges.

Turning now to FIG. 2, the timing sequence is shown graphically for the relationship between the high voltage pulse applied to the unknown resistance element 11, the command signal to the sample and hold circuits 21 and 22, the command signal to the analog-to-digital converters 23 and 24 and the end of conversion signal applied on the output 25 from the analog-to-digital converter 23. The timing is based upon the beginning of a high voltage pulse appearing at the output of the pulse source 12. The pulse rapidly rises from zero volts to 1000 volts and remains constant for a predetermined time interval, say, 50 microseconds. The pulse then returns to zero and remains low until the next pulse is applied to the unknown element 11. If desired, the pulse source 12 may be adapted such that the output pulse frequency is variable for simulating various speeds of an internal combustion engine when the element 11 is an ignition noise suppression element used in an internal combustion engine. A signal of much lower magnitude similar to the high voltage pulse is applied on the output 27 from the pulse source 12 to the trigger circuit 26. The trigger circuit 26 then delays for a predetermined time interval, 15 microseconds in this case, to allow for the pulse on the unknown element 11 to reach its maximum voltage and then the trigger circuit 26 applies a command signal for 24 microseconds simultaneously to both of the sample and hold circuits 21 and 22. The exemplary Datel sample and hold circuits have a 6 microsecond acquisition time and therefore will have an accurate output at the termination of the 24 microsecond command signal. Shortly after such command signal is terminated, the trigger circuit 26 applies a command signal over its output 29 to begin conversion simultaneously in both of the analog-to-digital converters 23 and 24. The exemplary Datel analog-to-digital converters require a command signal with only 100 nanoseconds duration to initiate conversion. Therefore, the command signal may be of any duration over 100 nanoseconds, such as about 20 to 25 microseconds. About 40 nanoseconds after the initiation of the command signal, the converter 23 will apply a signal on the end of conversion output 25. This signal will remain on the output 25 for 100 microseconds, or until conversion is completed. The trigger circuit 26 generates the two command signals for the sample and hold circuits and the analog-to-digital converters and the converter 23 has an end of conversion output 25 in the same phase relationship each time a high voltage pulse is applied by the source 12 to the unknown element 11.

Details of a trigger circuit 26 for providing command signals having the timing known in FIG. 2 is shown in the circuit of FIG. 3. The trigger circuit 26 basically comprises a one-shot multivibrator 54 for generating a sample and hold command on the output 28 and a one-shot multivibrator 55 for generating an analog-to-digital conversion command on the output 29 in response to receipt of a trigger signal on the output 27 from the pulse source 12. The level of the trigger signal on the pulse source output 27 is limited by two series connected zener diodes 56 and 57. An optional switch 58 selectively connects a terminal 59 directly to the pulse source output 27 or to the junction between the zener diodes 56 and 57. The switch 58 is provided to permit selecting the signal level to the terminal 59 depending upon the level of the low voltage pulses on the output 27 from the pulse source 12. For example, the zener diodes 56 and 57 may be selected such that when 15-volt pulses are applied on the output 27, the switch 58 connects the terminal 59 directly to the output 27 and when a higher voltage, such as 20-volt pulses, are received, the switch 58 connects the terminal 59 to the junction between the diodes 56 and 57. This arrangement is merely provided to increase the versatility of the trigger circuit 26 for operating with different level pulse sources 12 and the switch 58 may be eliminated when the apparatus 10 is to incorporate a pulse source having a single level low voltage output for driving the trigger circuit 26.

The terminal 59 is connected through a resistor 60 to ground and through a series variable resistor 61 and capacitor 62 to ground. A junction 63 between the series resistor 61 and capacitor 62 is connected to the input of the multivibrator 54. The multivibrator 54 includes two NOR gates 64 and 65, a capacitor 66 and a resistor 67. The junction 63 is connected to one input of the NOR gate 64 and the output of the NOR gate 65 is connected to the other input of the NOR gate 64. The output from the NOR gate 64 is connected through the capacitor 66 to both inputs of the NOR gate 65. The NOR gate 65 is functionally the equivalent of an inverter. The inputs of the NOR gate 65 are also connected through the resistor 67 to a positive voltage source. In operation, both inputs to the NOR gate 65 will normaly be high or at a logic one state due to the positive voltage source connected through the resistor 67 to such inputs. The zero input from the gate 65 to the gate 64 causes the gate 64 to apply a high or logic one signal to the capacitor 66. The gates 64 and 65 will remain in this steady state condition until the input from the junction 63 to the gate 64 changes. When a pulse is received on the output 27 from the pulse source 12, the voltage on the junction 63 will increase at a rate dependent upon the RC time constant of the resistor 61 and the capacitor 62. The resistor 61 may be adjusted to provide a desired delay in triggering the monostable multivibrator 54 at a predetermined point in the pulse, such as 15 microseconds after initiation of the pulse. At this point, the voltage on the junction 63 is sufficient to cause the output of the NOR gate 64 to go to a logic zero or ground. The voltage on the inputs to the NOR gate 65 is then grounded through the capacitor 66, causing the output of the NOR gate 65 to go to a positive or logic one level. This positive signal is maintained on an input to the gate 64 to hold the output of the gate 64 at a grounded or logic zero level even though the pulse on the junction 63 may have terminated. The multivibrator 54 will maintain a positive output from the gate 65 until the inputs to the gate 65 have reached a sufficient voltage to become a positive or logic one level. The time required for the inputs to the gate 65 to change is determined by the RC time constant of the resistor 67 and the capacitor 66, as well as the level of the positive voltage applied to the resistor 67. As shown in the graph of FIG. 2, the time constant of the resistor 67 and the capacitor 66 is selected to provide a 24 microsecond delay before the multivibrator 54 returns to its stable state. The output from the NOR gate 65 is also connected through a resistor 68 to the base of a transistor 69. The emitter of the transistor 69 is grounded and the collector is connected to the output terminal 28 for applying a command signal to both of the sample and hold circuits 21 and 22 (FIG. 1).

As illustrated above in FIG. 2, the command to the analog-to-digital converters 23 and 24 must lag behind the command to the sample and hold circuits 21 and 22 since conversion cannot be initiated until after the sample and hold circuits 21 and 22 have acquired signals. The junction 63 which supplies the command signal to the multivibrator 54 is connected through an RC time delay circuit comprising a series resistor 70 and capacitor 71 for supplying a delayed command signal on a junction 72 to the multivibrator 55. The voltage on the junction 72 lags behind the voltage on the junction 63 when a pulse is received on the pulse source output 27. The time constant established by the resistor 70 and the capacitor 71 is selected such that the multivibrator 55 is not triggered until after the multivibrator 54 returns to its stable state. The multivibrator 55 includes two NOR gates 73 and 74, a capacitor 75 and a resistor 76 connected in a manner similar to that for the multivibrator 54. The junction 72 and the output of the NOR gate 74 are connected to the two inputs to the NOR gate 73. The output of the NOR gate 73 is connected through the capacitor 75 to both inputs to the NOR gate 74 and a positive voltage source is also connected through the resistor 76 to both inputs of the NOR gate 74. Normally, both inputs to the NOR gate 73 will be at a logic zero or ground level and both inputs to the NOR gate 74 will be at a positive or logic one level. When the voltage on the junction 72 rises to a predetermined level, the output of the NOR gate 73 will change to a logic zero level causing both inputs to the NOR gate 74 to go to a logic zero level or ground. The NOR gate 74 will then apply a positive signal on the analog-to-digital converter command output 29 and also maintain a positive signal on one input to the NOR gate 73. The multivibrator 55 will remain in this state until the inputs to the gate 78 rise to a logic one level after a predetermined time interval as determined by the RC time constant of the resistor 76 and the capacitor 75, whereupon the output from the NOR gate 74 will change to a ground or logic zero level. Thus, upon receipt of a signal on the low voltage output 27 from the pulse source 12, the trigger circuit 26 will provide a sample and hold command on an output 28 after a predetermined time interval, such as 15 microseconds, and will subsequently provide an analog-to-digital conversion command on an output 29 after a further predetermined time interval, such as 41 microseconds, after receipt of the trigger pulse.

Turning now to FIG. 4, circuit details are shown for the adder 30 which doubles the output from the voltage analog-to-digital converter 23, for the A/B select register 31, for the driver amplifiers 32, for the shift register 33 and for the 16-bit adder 34. As previously indicated, the exemplary analog-to-digital converter 23 provides 12 data bits corresponding to a voltage ranging from zero 10 volts across the voltage divider resistor 18. These 12 bits are doubled in the adder 30 and subsequently multiplied by 10 in the register 31, the register 33 and the adder 34. The adder 30 comprises three 4-bit binary full adders 80, 81 and 82 which are commercially available integrated circuits. Each of the adders 80, 81 and 82 has four A inputs and four B inputs. The corresponding A and B inputs are added together for each of the four bits. The corresponding A and B inputs are connected together to provide an output which is double the input. Thus, an input 83, for example, which carries the least significant bit from the converter 23 is connected to both the A1 and the B1 inputs for addition together or doubling the value of the input. The other eleven inputs from the analog-to-digital converter 23 are respectively connected to corresponding A and B inputs to the adders 80, 81 and 82. The carry out terminal from the adder 80 is connected to the carry in terminal of the adder 81 and similarly the carry out terminal from the adder 81 is connected to the carry in terminal of the adder 82. With such a connection, the adders 80, 81 and 82 generate twelve data outputs plus a carry output 84 which forms a 13-bit binary signal equal to twice the binary output from the converter 23.

The output from the adder 30 is multiplied by a factor of 10 to form a 16-bit binary signal ranging from zero to 100 which corresponds to a voltage ranging from zero to 1000 volts across the unknown element 11. Multiplication is accomplished by means of the A/B select register 31, the shift register 33 and the adder 34. The select register 31 comprises four integrated circuit quadruple 2-input data selector/multiplexers 85–88. Each data selector 85, 86, 87 or 88 has a set of four A inputs and a set of four B inputs. When a signal is received on a select A input 89, the four A inputs to each of the selectors 85–88 are connected to four corresponding data outputs. Similarly, when a signal is received on a select B input 90, the four B inputs for each of the selectors 85–88 are connected to the corresponding four data outputs. Thus, the four data selectors 85–88 selectively connect a total of two groups of 16 inputs to 16 outputs. The A inputs to the selector 85 are connected to the corresponding outputs of the adder 80, the A inputs to the selector 86 are connected to the corresponding outputs of the adder 81, the A inputs of the selector 87 are connected to the corresponding outputs of the adder 82 and the A1 input to the selector 88 is connected to the thirteenth or carry output 84 from the adder 82. The remaining A inputs to the selector 88 are not used. The 16 B inputs to the selectors 85–88 are connected to the 16 outputs of corresponding significance from the 16-bit adder 34.

The data select register 31 has sixteen individual outputs which are connected through 16 individual driver amplifiers 32 to sixteen inputs to the shift register 33. The shift register 33 may comprise four integrated circuit 4-bit parallel in, parallel out shift registers 91–94. Signals appearing on the input to the shift registers 91–94 are shifted to four corresponding outputs for each such register when a shift signal is received on a shift input 95 connected in parallel to each of the four registers 91–94. The 16 outputs from the shift register 33 are connected to 16 A inputs to the 16-bit adder 34. The 16-bit adder 34 comprises four 4-bit binary full adders 96–99 which may be commerically available integrated circuits similar to those used for the three adders 80–82. The four A inputs to the adder 96 are connected to the corresponding outputs from the shift register 91, the four A inputs to the adder 97 are connected to the corresponding outputs from the shift register 92, the four A inputs to the adder 98 are connected to the corresponding outputs from the shift register 93 and the four A inputs to the adder 99 are connected to the corresponding outputs from the shift register 94. The 13-bit binary output from the adder 30 is maintained continuously on the B inputs to the adder 34. Thus, the four outputs from the adder 80 are connected to the corresponding four B inputs to the adder 96, the four outputs from the adder 81 are connnected to the corresponding four B inputs to the adder 97, the four outputs from the adder 82 are connected to the corresponding four B inputs to the adder 98 and the carry output 84 from the adder 82 is connected to the B1 input to the adder 99. The remaining B inputs to the adder 99 are not used and therefore are connected to ground. The carry output from the adder 96 is connected to a carry input on the adder 97, the carry output from the adder 97 is connected to a carry input on the adder 98 and the carry output from the adder 98 is connected to the carry input of the adder 99 to complete interconnections between the individual adders 96–99. The adders 96–99 form a 16-bit output 100 which is applied to the A input of the A/B select register 36 (FIG. 6) where it is divided by a signal corresponding to the current through the unknown element 11.

The operation of the A/B select register 31, the shift register 33 and the adder 34 for multiplying the output of the adder 30 by a factor of ten is controlled by the control logic 35. Initially, the control logic 35 places a signal one the select A input 89 to the A/B select register 31 and the binary data appearing at the output of the adder 30 passes through the register 31 to the shift register 33. The same binary data from the adder 30 also is maintained constantly on the B inputs to the adder 34. Next, the control logic 35 applies a clock pulse to the shift input 95 of the shift register 33, causing the data from the adder 30 to pass to the A inputs to the adder 34, whereupon the binary data on the A and B inputs to the adder 34 are summed. Thus, the outputs 100 from the adder 34 will equal two times the output from the adder 30 since the same value will appear on both the A and the B inputs to the adder 34. Next, the control logic 35 removes the signal from the select A input 89 and places a signal on the select B input 90 of the A/B select register 31. The output 100 from the adder 34 is applied to the B inputs of the data select register 31. Since the select B input 90 is now energized, this data passes to the shift register 33. With each new clock pulse to the shift input 95 of the shift register 33, a new sum is generated by the adder 34 which is equal to the prior output from the adder 34 plus the output from the adder 30. Thus, after the second clock pulse is applied on the shift input 95, the adder 34 will have an output equal to three times the output of the adder 30. Clock pulses continue to be applied to the shift input 95 until after the ninth clock pulse, at which time the output of the adder 34 equals ten times the output of the adder 30, whereupon the function is complete and the output 100 will have a range of from zero to 100 volts across the resistor 18. Details of the control logic 35 for generating the select A and select B pulses and the shift register clock pulses will be described below in reference to FIG. 7.

As indicated above, division is actually accomplished by repeatedly adding the 2's complement of the digitized current to the digitized and expanded voltage. The 2's complement is generated by the circuit 37 which is shown in detail in FIG. 5. The 2's complement circuit 37 basically comprises twelve exclusive-OR gates 105 and a 16-bit adder 106 composed of four integrated circuit 4-bit binary full adders 107–110. One input to each of the 12 exclusive-OR gates 105 is connected to a positive voltage source and the other inputs to the gates 105 are connected to the 12 output bits from the current analog-to-digital converter 24. The exclusive-OR gates 105 change the digitized current data from the converter 24 to the 1's complement of such data and the 16-bit binary adder 106 adds 1 to such 1's complement to generate the 2's complement of the digitized current data. The twelve outputs from the twelve exclusive-OR gates 105 are connected to the twelve A inputs to the adders 107, 108 and 109, with the least significant bit applied to the A1 input to the adder 107 and the most significant bit applied to the A4 input of the adder 109, and the A inputs to the adder 110 are connected to the positive voltage source. The B1 input to the adder 107 is connected to a positive voltage source (not shown). The remaining B inputs to the adder 107 and the B inputs to the adders 108, 109 and 110 are all grounded. Thus, 1 is added to the signal applied to the A1 input to the adder 107. The carry output from the adder 107 is connected to the carry input to the adder 108, the carry output of the adder 108 is connected to the carry input of the adder 109 and the carry output of the adder 109 is connected to the carry input of the adder 110. The adder 107 has four data outputs 111, the adder 108 has four data outputs 112, the adder 109 has four data outputs 113 and the adder 110 has four data outputs 114 to provide a 16-bit binary output from the adder 106. These outputs are applied to B inputs to the 16-bit adder 38, as shown in detail in FIG. 6.

Turning to FIG. 6, details are shown of circuitry including the A/B select register 36, the 16 driver amplifiers 39, the shift register 40 and the 16-bit adder 38 which function to repeatedly add the 2's complement of the digitized current data from the circuit 37 to the expanded digitized voltage data from the adder 34. The 16 outputs 100 from the 16-bit adder 34 are connected to the A inputs of the A/B select register 36 which consists of four quadruple 2-input data selector/multiplexers 119–122 with the least significant bit applied to the A1 input to the selector 119 and the most significant bit applied to the A4 input of the selector 122. The B inputs to the data selectors 119–122 are connected to the outputs from the 16-bit adder 38, with the least significant bit applied to the B1 input of the selector 119 and the most significant bit applied to the B4 input of the selector 122. The sixteen outputs from the A/B select register 36 are connected through sixteen individual driver amplifiers 39 to 16 inputs to the shift register 40.

The shift register 40 is constructed from four integrated circuit 4-bit parallel in, parallel out shift registers 123–126. The registers 123–126 have a total of sixteen outputs which are connected to the A1 inputs to the 16-bit adder 38. The 16-bit adder 38 is composed of four commercially available integrated circuit 4-bit binary full adders 127–130. The four B inputs to the adder 127 are connected to the four outputs 111 from the adder 107 (FIG. 5), the four B inputs to the adder 128 are connected to the four outputs 112 from the adder 108, the four B inputs to the adder 129 are connected to the four outputs 113 from the adder 109 and the four B inputs to the adder 130 are connected to the four outputs 114 from the adder 110. Thus, the 2's complement of the digitized current data is applied to the B inputs of the 16-bit adder 38. The individual adders 127–130 are interconnected, with the carry output from the adder 127 connected to the carry input to the adder 128, the carry output from the adder 128 connected to the carry input to the adder 129 and the carry output from the adder 129 connected to the carry input of the adder 130. The binary full adder 127 has four data output lines 131, the binary full adder 128 has four data outputs 132, the binary full adder 129 has four data outputs 133 and the binary full adder 130 has four data outputs 134. In addition, a carry output 135 from the adder 130 forms a sign bit indicating the sign of the result from the adder 38. The outputs 131–134 are connected, respectively, to the B inputs to the A/B select registers 119–122 which comprise the select register 36.

The select register 36 and the shift register 40 are controlled by the control logic 35 for performing the repeated addition steps. The control logic 35 initially applies a signal on a select A input 136 to the A/B select register 36. This causes the expanded voltage signal from the adder 34 to pass through the register 36 and the driver amplifiers 39 to the shift register 40. The control logic 35 then applies a clock pulse to a shift or clock input 137 to the shift register 40 to shift the expanded voltage data to the adder 38. The adder 38 combines the expanded voltage data with the 2's complement of the current data from the circuit 37 and the sum appears at the outputs 131–135. The sum is also applied to the B inputs to the A/B select register 36. Next, the control logic 35 removes the signal from the select A input 136 and applies a signal on a select B input 138 to the A/B select register 36 to apply the sum to the shift register 40. The next clock pulse applied by the control logic 35 to the shift input 137 causes the 2's complement of the current from the circuit 37 to be combined in the adder 38 with the previous sum appearing at the output of the adder 38 and the new sum now appears at the output of the adder 38. Each subsequent clock pulse causes the 2's complement of the current data to be added to the prior sum.

The outputs 131–135 are connected to the control logic 35 which includes a bit detector circuit. This circuit detects when either the outputs 131–134 become a logic zero or when the sign bit on the sign output 135 changes logic levels, whereupon clock pulses to the shift input 137 of the shift register 40 are terminated. A count of the total number of clock pulses applied to the shift input 137 during a cycle of the apparatus 10 equals the result, or a measure of the resistance of the unknown element 11.

Turning now to FIG. 7, details are shown for the control logic 35. The control logic 35 applies signals on the select A input 89 and the select B input 90 to the A/B select register 31, applies clock pulses to the shift input 95 of the shift register 33, applies signals to the select A input 136 and the select B input 138 of the A/B select register 36 and applies clock pulses to the shift input 137 of the shift register 40 for controlling both the expansion of the voltage data by a factor 10 and the addition of the 2's complement of the current data to the expanded voltage data. The control logic 35 is activated by a signal on the end of conversion output 25 from the voltege analog-to-digital converter 23. This signal is applied to a one-shot multivibrator 143. The multivibrator 143 consists of two NOR gates 144 and 145, a capacitor 146 and a resistor 147. The end of conversion output 25 and the output from the NOR gate 145 are connected to the inputs of the NOR gate 144. The output of the NOR gate 144 is connected through the capacitor 146 to both inputs of the NOR gate 145. The inputs from the NOR gate 145 are also connected through the resistor 147 to a positive voltage source (not shown). When a signal is received on the end or conversion output 25, the output of the NOR gate 144 will go to a logic zero or ground level, causing the gate 145 to have a high output. The high output from the gate 145 causes the output of the gate 144 to remain low, even if the end of conversion signal is removed from the gate 144. The multivibrator 143 will remain in this state for a time interval determined by the RC time constant of the register 147 and the capacitor 146 which, for the exemplary embodiment described herein, is set to 300 microseconds. After this time interval, a sufficient voltage will appear on the inputs to the gate 145 to cause the output of the gate 145 to change to a logic zero or ground level and the output of the multivibrator 143 then returns to its stable state.

The output from the NOR gate 145 is also connected through an RC time delay circuit consisting of a resistor 148 and a capacitor 149 to a latch 150 consisting of two NOR gates 151 and 152 and a resistor 153. In the embodiment described herein, the resistor 148 and the capacitor 149 are selected to provide a 200 microsecond time delay before setting the latch 150. The junction between the resistor 148 and the capacitor 149 are connected to one input of the gate 151. The output of the gate 151 is connected to both inputs of the gate 152. The output of the gate 152 is connected through the resistor 153 to the input of the gate 151 and also to a reset input to a 1 kHz. clock generator 154. After the 200 microsecond time delay established by the resistor 148 and the capacitor 149, the output of the gate 151 goes to a logic zero or ground condition and the gate 152 generates an output signal which starts the clock generator 154. The clock generator 154 then applies clock pulses on the shift input 95 to the shift register 33 and also to a reset terminal of a flip-flop 155 and to a clock pulse input to a divide-by-ten circuit 156. The Q output of the flip-flop 155 is connected to the select A input 89 and the $\overline{Q}$ output is connected to the select B input 90 of the A/B select register 31. The flip-flop 155 is initially in a set state so that a signal is applied to the select A input 89 of the register 31. The first clock pulse from the clock generator 154 causes the voltage data from the adder 30 to be transferred to the A input of the adder 34 (see FIG. 4). The first clock pulse also resets the flip-flop 155 to energize the select B input 90 of the register 31 instead of the select A input 89. Subsequent clock pulses on the shift input 95 to the shift register 33 cause the output of the adder 34 to pass through the select register 31 and the shift register 33 to the A inputs of the adder 34. The divide-by-ten circuit 156 generates a signal on an output 157 after counting nine clock pulses from the generator 154. The output 157 is connected through a resistor 158 to the base of a transistor 159. The base of the transistor 159 is also connected through a capacitor 160 to ground. The emitter of the transistor 159 is grounded and the collector is connected to the input of the NOR gate 151 in common with the resistor 153. When the divide-by-ten circuit 156 applies a signal on the output 157 after nine clock pulses, the transistor 159 is switched on after a time delay determined by the RC time constant of the resistor 158 and the capacitor 160 to ground input to the NOR gate 151 which was previously maintained high by the output from the gate 152, thereby releasing the latch 150. When the latch 150 is released, the output of the gate 151 clears the divide-by-ten circuit 156 and sets the flip-flop 155. At the same time, the output of the gate 152 will become high to inhibit the clock generator 154. At this time, the output of the adder 34 will be equal to the digitized voltage data from the adder 30 multiplied by a factor of ten.

The output 157 from the divide-by-ten circuit 156 is also connected through an RC time delay circuit consisting of a variable resistor 161 and a capacitor 162 to a latch 163 consisting of a NOR gate 164, a NOR gate 165 and a resistor 166. A short time interval after the circuit 156 applies a signal on the output 157, the output from the NOR gate 164 goes to a ground or logic zero level and the output of the NOR gate 165 goes to a logic one level. The output of the NOR gate 165 enables a clock generator 167 to generate a 1 kHz. clock pulse train. A clock pulse output from the generator 167 is applied to the shift or clock input 137 to the shift register 40 and also to the reset input of a flip-flop 168. The flip-flop 168 has a Q output connected to the select A input 136 and a $\overline{Q}$ output connected to the select B input 138 of the A/B select register 36 (FIG. 6). Initially, the flip-flop 168 is set so that a signal appears on the select A input 136 at the time of the first clock pulse on the shift input 137 to the shift register 40. After the first clock pulse, the flip-flop 168 is cleared and a signal will be applied to the select B input 138 for the remaining clock pulses on the shift input 137. During the first clock pulse to the shift input 137, the 2's complement of the current data is added in the adder 38 to the expanded voltage data from the adder 34. During each subsequent clock pulse, the output of the adder 38 is added to the 2's complement of the current data. This addition step is continuously repeated until a bit detector 169 detects that either all bits in the output of the adder 38 go to a ground or a logic zero state or the sign of the output from the adder 38 changes.

The bit detector 169 consists of four 4-input NOR gates 170–173 and two NAND gates 174 and 175. The four outputs 131 from the 4-bit binary full adder 127 (FIG. 6) are connected to the four inputs of the NOR gate 170, the four outputs 132 from the 4-bit binary full adder 128 are connected to the four inputs of the NOR gate 171, the four outputs 133 from the 4-bit binary full adder 129 are connected to the four inputs of the NOR gate 172 and the four outputs 134 from the 4-bit binary full adder 130 are connected to the NOR gate 173. The outputs of the four gates 170–173 are connected to individual inputs of the NAND gate 174. When each of the outputs 131–134 are at a logic zero level, the outputs of the gates 170–173 will all be high or a logic one level and the gate 174 will have a logic zero output. The output of the gate 174 and the sign output 135 from the 4-bit binary full adder 130 (FIG. 6) are connected to the two inputs of the gate 175. If either all of the outputs 131–134 go to a logic zero or the sign output 135 goes from a logic one to a logic zero, division is complete and the gate 175 will apply an output to trigger a monostable multivibrator 175. The multivibrator 176 consists of two NOR gates 177 and 178, a capacitor 179 and a resistor 180. The output of the NAND gate 175 and the output from the NOR gate 178 are connected to the inputs of the NOR gate 177. The NOR gate 177 has an output connected through the capacitor 179 to both inputs of the NOR gate 178. The inputs to the gate 178 are also connected through the resistor 180 to a positive voltage source (not shown). When the gate 175 from the bit detector 169 applies a trigger signal to the input of the gate 177, the output of the gate 177 will go to a logic zero or ground state and the output of the gate 178 will go to a logic one state. The state of the multivibrator 176 will remain for a time increment determined by the RC time constant of the capacitor 179 and the resistor 180. The output of the NOR gate 178 is also connected through a resistor 181 to the base of a transistor 181. The base of the transistor 182 is also connected through a capacitor 183 to ground. The emitter of the transistor 182 is grounded and the collector is connected to the input to the NOR gate 164 of the latch 163 in common with the resistor 166. When the bit detector 169 generates an output to trigger the multivibrator 176, the transistor 182 is switched on after a short time delay determined by the RC time constant of the resistor 181 and capacitor 183 to ground the input to the NOR gate 164, thereby resetting the latch 163. When the latch 163 is reset, the output of the NOR gate 164 sets the flip-flop 168 and the output of the NOR gate 165 inhibits the clock generator 167 to terminate clock pulses on the shift input 137 to the shift register 40. At this time, a count of the total number of clock pulses applied on the shift register clock input 137 equals the result from dividing the expanded voltage data by the current data.

The numerical display circuit is shown in detail in FIG. 8. The clock input 137 to the shift register 40 is also connected as a clock input to the decade counter 41. The counter 41 has a binary output corresponding to a pulse count of from zero through nine. On the tenth pulse, a carry output from the counter 41 is applied to the clock input of the decade counter 42. The decade counter 42 also has a binary output and every tenth count applies a carry output to a clock input to the decode counter 43. The three counters 41–43 store three decades of resistance data in a binary coded decimal (BCD) format, with the least significant digit stored in the counter 41 and the most significant digit stored in the counter 43. Each time a high voltage pulse is applied by the pulse source 12 to the unknown element 11 and, subsequently, the voltage analog-to-digital converter 23 cycles, the end of conversion output 25 from the onverter 23 resets the counters 41–43. As division is subsequently performed by the repeated steps of adding the 2's complement of the current data to the expanded voltage data, each clock pulse to the shift register 40 increments the counters 41–43 until the bit detector 169 detects either a zero output from the adder 38 or a change in the sign bit output 135 from the adder 38. At this time, the count stored in the counters 41–43 corresponds to the resistance of the element 11.

By proper selection of the components of the apparatus 10, the indicated resistance may cover any suitable range, such as the counter 41 storing K. ohms or 1000 ohm units, the counter 42 storing 10 K. ohms and the counter 43 storing 100 K. ohms. The BCD output from the coutner 41 is applied to the BCD-to-seven segment decoder/driver 44 which drives the seven segment indicator 47. Similarly, the BCD output from the counter 42 is applied to the BCD-to-seven segment decoder/driver 45 which drives the seven segment indicator 48 and the BCD output from the counter 43 is applied to the BCD-to-seven segment decoder/driver 46 which drives the seven segment indicator 49. The indicators 47–49 are of any suitable type and, for example, may have seven segments which are selectively illuminated by light emitting diodes, incandescent lamps or gaseous discharge lamps. Of course, it will be appreciated that the drivers 44–46 may, in the alternative, consist of BCD-to-decimal decoder/drivers and the indicators 47–49 are then provided with ten separate filaments or segments for indicating the individual digits, such as the ten gaseous discharge tubes within a Nixie tube indicator.

Although specific circuitry has been described above for performing the division operation for dividing digital data corresponding to the voltage through the unknown element 11 by a digital data corresponding to the current through such element 11, it will be appreciated that in the broadest aspect of the invention, other known division methods may be used. It will also be appreciated that the range of the apparatus 10 may be modified for indicating resistances falling within different ranges. HOwever, in general, the resistance range will generally be on the order of 1000 ohms or more since high voltage pulses are not normally applied to extremely low valued resistance elements.

The pulse source 12 has been described as generating pulses having substantially a square waveform, as shown at the top of FIG. 2. It will be appreciated that pulses of other configurations may be applied to the element 11. For example, the repetitive high voltage pulses may take the form of positive half cycles of a sine wave. The sampling point for the current through and the voltage across the element 11 may be set to any point in the pulse (not necessarily at the peak voltage) merely by varying the resistor 61 to trigger the sample and hold circuits 21 and 22 at a desired point in the pulse. If the capacitor 62 is selected to have a value of 0.01 ufd. and the resistor 61 is variable between zero and 10,000 ohms, then the RC time constant of the resistor 61 and capacitor 62 is variable between zero and 100 microseconds. The output 28 from the trigger circuit 26 to the sample and hold circuits 21 and 22 is delayed from zero to 100 microseconds after a high voltage pulse is first applied to the element 11 for sampling voltage and current at any point in a high voltage pulse haing a pulse width of up to 100 microseconds.

Of course, the values of the variable resistor 61 and the capacitor 62 may be selected to give other desired RC time constant ranges. It will also be appreciated that various other changes and modifications may be made without departing from the spirit and scope of the claimed invention.

1. Apparatus for measuring the effective electrical resistance of an unknown element while subjected to repetitive high voltage pulses comprising, in combination, means for applying repetitive short duration high voltage pulses to the unknown element, means for generating a first analog voltage proportional to the voltage across the unknown element, means for generating a second analog voltage proportional to the current through the unknown element, first means responsive to a trigger signal for temporarily storing such first analog voltage, second means responsive to a trigger signal for temporarily storing such second analog voltage, means responsive to said high voltage applying means for simultaneously applying trigger signals to said first and second storing means at a predetermined point in each high voltage pulse applied to the unknown element, first means for digitizing the first analog voltage stored in said first storing means, second means for digitizing the second analog voltage stored in said second storing means, means for triggering both of said first and second digitizing means a predetermined time after new analog voltages are stored in said first and second storage means, means responsive to the digitized outputs from said first and second digitizing means for generating digital resistance data corresponding to the resistance of the unknown element, and display means responsive to such generated digital resistance data for indicating the resistance of the unknown element.

2. Apparatus for measuring the effective electrical resistance of an unknown element, as set forth in claim 1, and further including means for expanding by a predetermined factor at least one of the digitized outputs from said first and second digitizing means, and wherein said digital resistance data generating means is responsive to such expanded output for generating digital resistance data.

3. Apparatus for measuring the effective electrical resistance of an unknown element, as set forth in claim 1, wherein said means for generating digital resistance data comprises dividing means including means for generating the 2's complement of the digitized output from said second digitizing means, summing means for adding such 2's complement to the digitized output from said first digitizing means to obtain a sum and for repeatedly adding such 2's complement to the prior sum, means responsive to such sum equaling zero for inhibiting said summing means, means responsive to a change in the sign of such sum for inhibiting said summing means, and means for counting the number of times such 2's complement is added by said summing means, such count comprising the digital resistance data.

4. Apparatus for measuring the effective electrical resistance of an unknown element, as set forth in claim 3, and further including means for expanding the digitized output from said first digitizing means by a predetermined factor, and wherein said summing means adds such 2's complement to such expanded digitized output from said first digitizing means.

* * * * *

UNITED STATES PATENT OFFICE
CERTIFICATE OF CORRECTION

Patent No. 3,984,768                    Dated     October 5, 1976

Inventor(s) James T. Staples

It is certified that error appears in the above-identified patent and that said Letters Patent are hereby corrected as shown below:

Column 1, line 6, "measurements" should be -- measurement --.
Column 1, line 40, "Howevr" should be -- However --.
Column 2, line 11, "pulse" should be -- pulses --.
Column 3, line 32, after "element", insert -- 11 --.
Column 3, line 46, after "time", insert -- of --.
Column 3, line 54, "converters" should be -- converter --.
Column 3, line 55, "input" should be -- output --.
Column 4, line 66, "charge" should be -- chart --.
Column 5, line 56, "circiuit" should be -- circuit --.
Column 7, line 17, "known" should be -- shown --.
Column 7, line 60, "normaly" should be -- normally --.
Column 7, line 62, "input" should be -- output --.
Column 8, line 67, "78" should be -- 74 --.
Column 9, line 19, after "zero", insert -- to --.
Column 10, line 52, "one" should be -- on --.
Column 13, line 15, after "factor", insert -- of --.
Column 13, line 19, "voltege" should be -- voltage --.
Column 13, line 30, "or" should be -- of --.
Column 15, line 18, "175" should be -- 176 --.
Column 15, line 35, "181" should be -- 182 --.
Column 15, line 62, "decode" should be -- decade --.
Column 16, line 2, "onverter" should be -- converter --.
Column 16, line 17, "coutner" should be -- counter --.
Column 16, line 44, "HOwever" should be -- However --.
Column 16, line 68, "haing" should be -- having --.
Column 17, before the claims, insert -- WHAT I CLAIM IS: --.

Signed and Sealed this

Fourteenth Day of December 1976

[SEAL]

Attest:

RUTH C. MASON
Attesting Officer

C. MARSHALL DANN
Commissioner of Patents and Trademarks